United States Patent
Kerrigan et al.

(12)

(10) Patent No.: US 8,504,325 B2
(45) Date of Patent: Aug. 6, 2013

(54) COMPARABLE DIAGNOSTICS FOR RENEWABLE ENERGY POWER SYSTEMS

(75) Inventors: Shawn Kerrigan, Redwood City, CA (US); Asaf Peleg, San Francisco, CA (US); Michael Herzig, Edgewater, NJ (US)

(73) Assignee: Locus Energy, LLC

( * ) Notice: Subject to any disclaimer, the term of this patent is extended or adjusted under 35 U.S.C. 154(b) by 0 days.

(21) Appl. No.: 13/455,871

(22) Filed: Apr. 25, 2012

(65) Prior Publication Data

US 2012/0209440 A1    Aug. 16, 2012

Related U.S. Application Data

(63) Continuation of application No. 12/777,221, filed on May 10, 2010, now Pat. No. 8,190,395, which is a continuation-in-part of application No. 11/949,035, filed on Dec. 2, 2007, now Pat. No. 7,742,897, and a continuation-in-part of application No. 11/673,649, filed on Feb. 12, 2007, now abandoned.

(51) Int. Cl.
  *G06F 11/30*    (2006.01)

(52) U.S. Cl.
  USPC .......................................................... 702/182

(58) Field of Classification Search
  USPC .......................................................... 702/182
  See application file for complete search history.

(56) References Cited

U.S. PATENT DOCUMENTS

2004/0230377 A1*  11/2004  Ghosh et al. ..................... 702/3

* cited by examiner

*Primary Examiner* — Stephen Cherry
(74) *Attorney, Agent, or Firm* — Jennifer Meredith, Esq.; Meredith & Keyhani, PLLC

(57) ABSTRACT

A computer processor implemented method of measuring, monitoring, comparing and diagnosing the power generated of at least two renewable power systems provided to at least two consumers and alerting at least one of consumers in the event of comparative underperformance, the method taking into account at least two diagnostic variables including weather and the renewable power system cover status (such as covered by snow), wherein the at least one data server determines comparative information for a predetermined geographic area based upon at least two diagnostic variables, and at least two normalized performances to provide a comparative value; and informing the consumer of the comparative value in the event of an underperforming comparative value.

21 Claims, 6 Drawing Sheets

Figure 1- Comparison Calculations
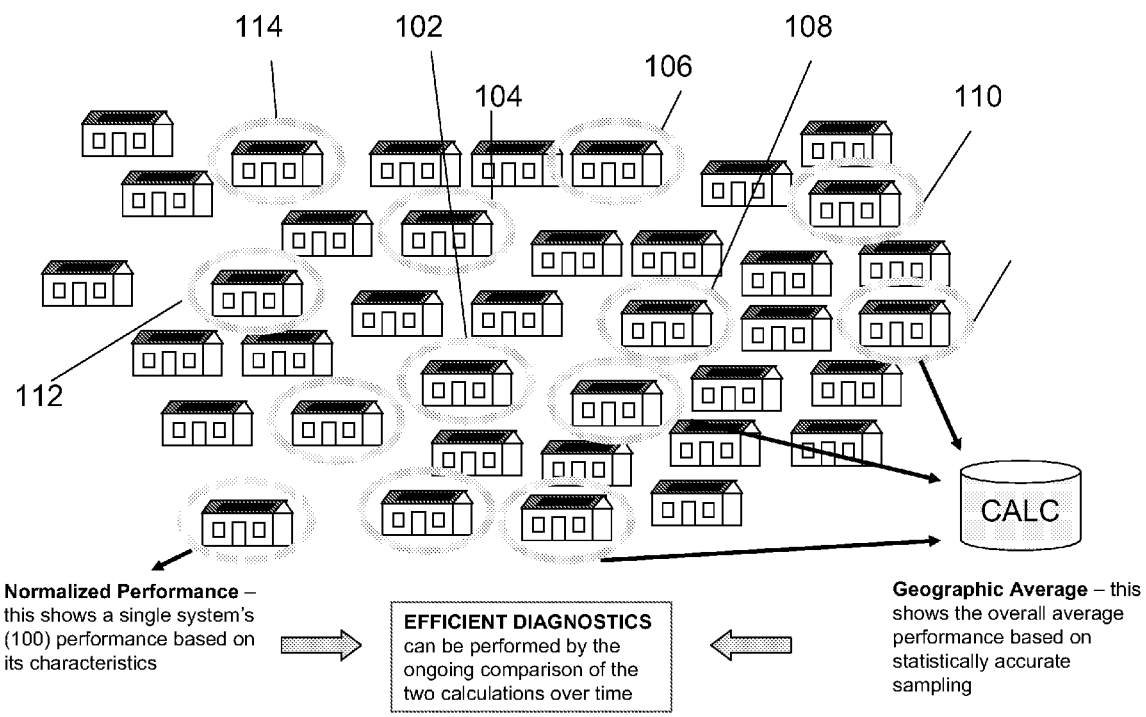

Figure 2 - Potential Components
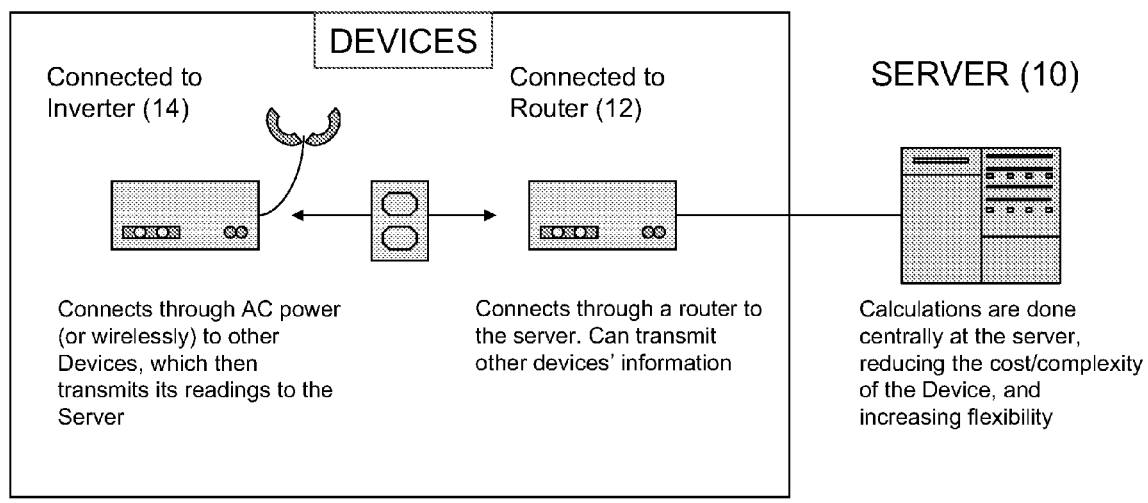

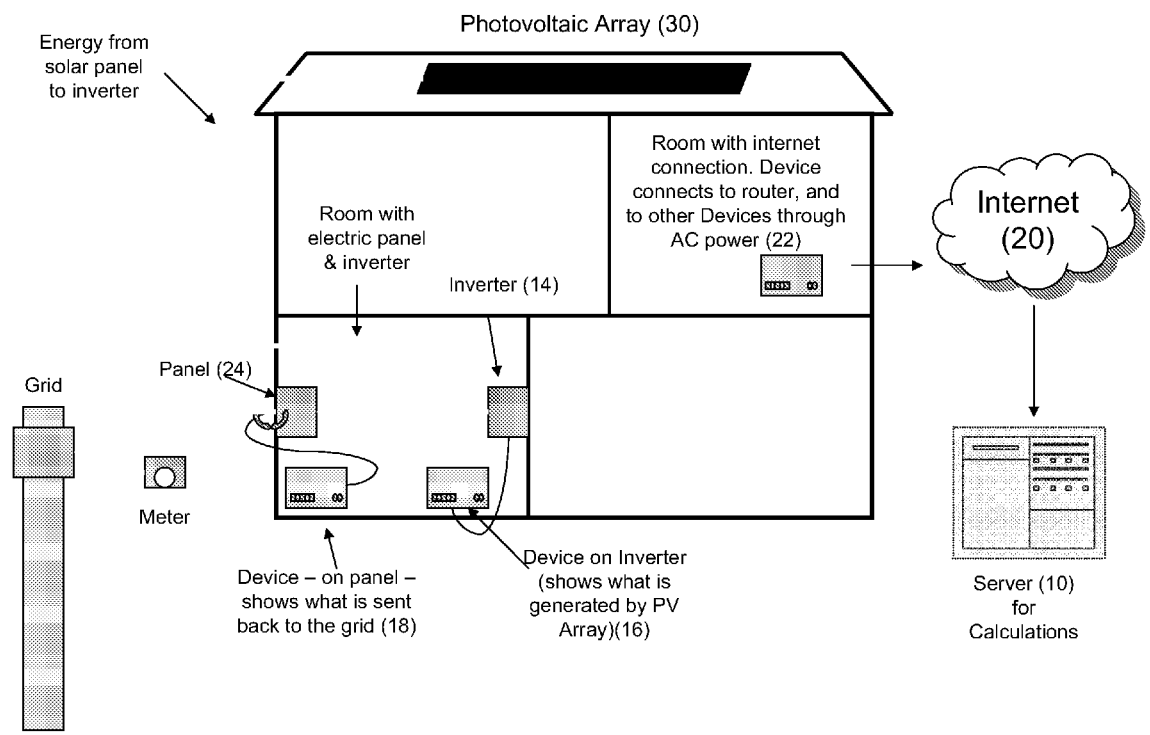
Figure 3- Sample PV Configuration

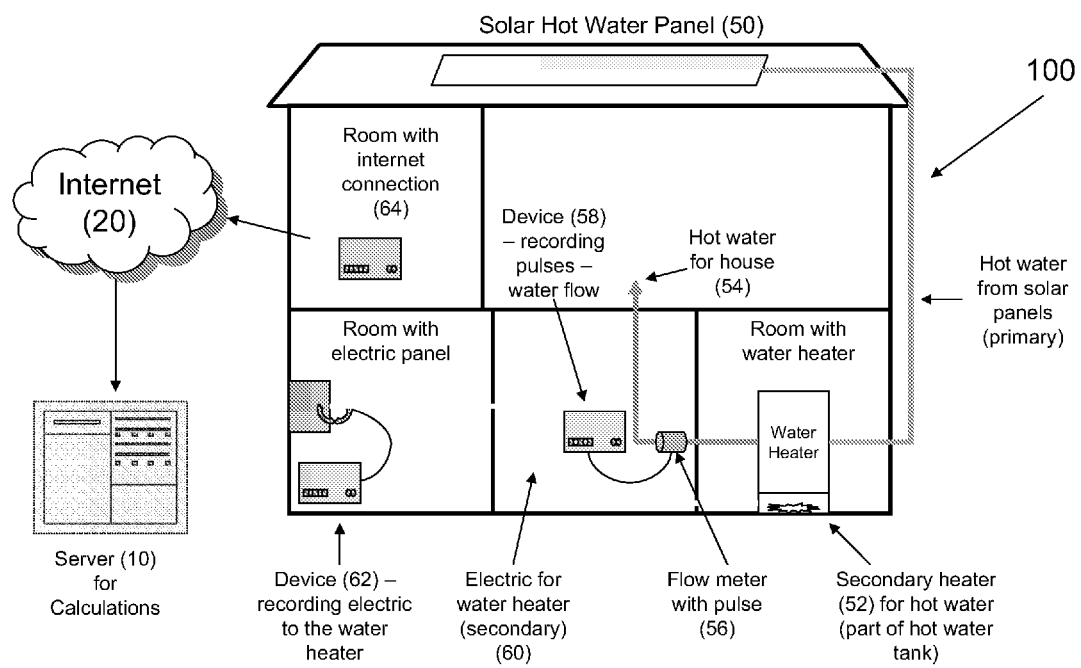
Figure 4- Sample SHW Configuration

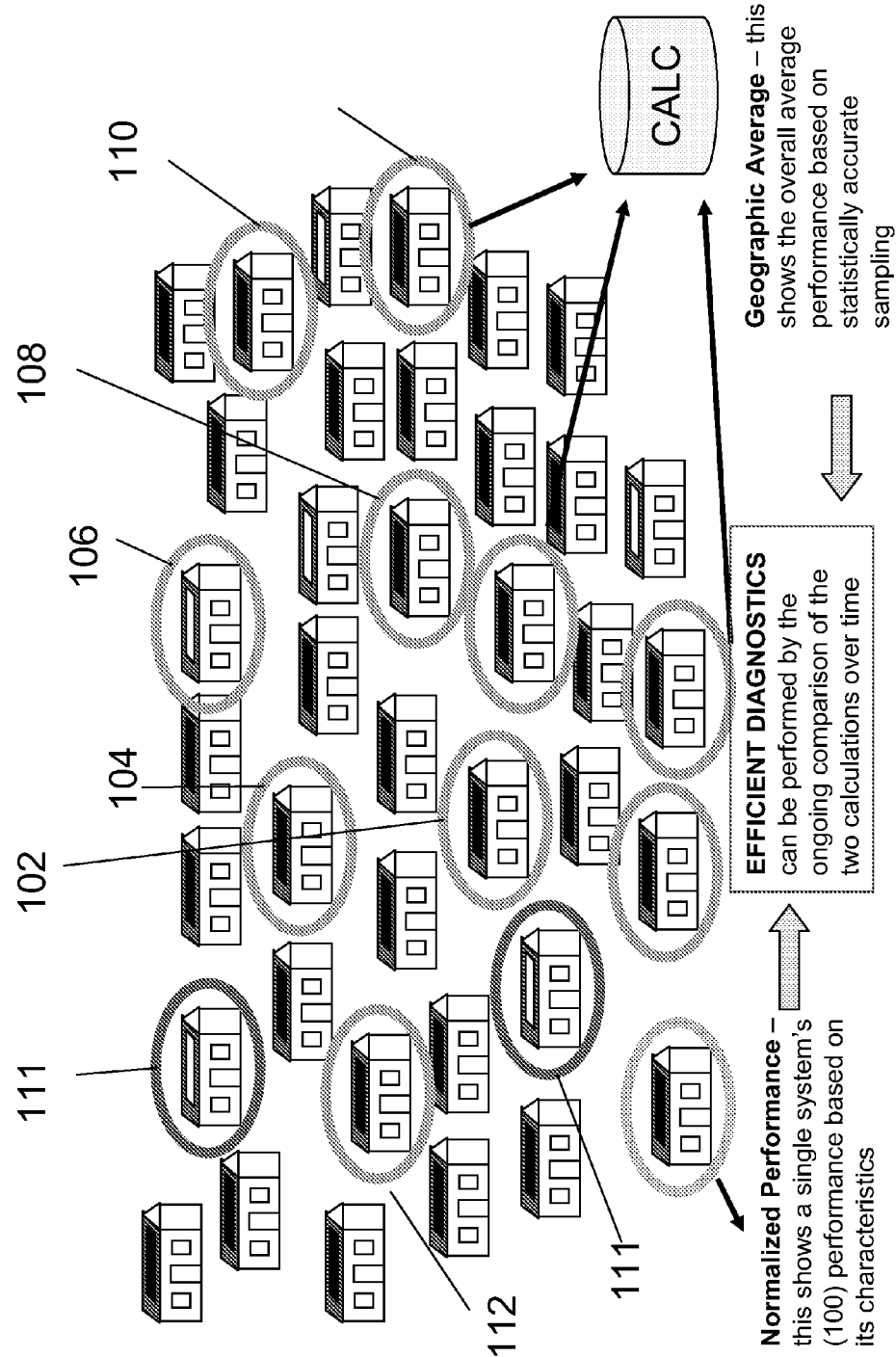

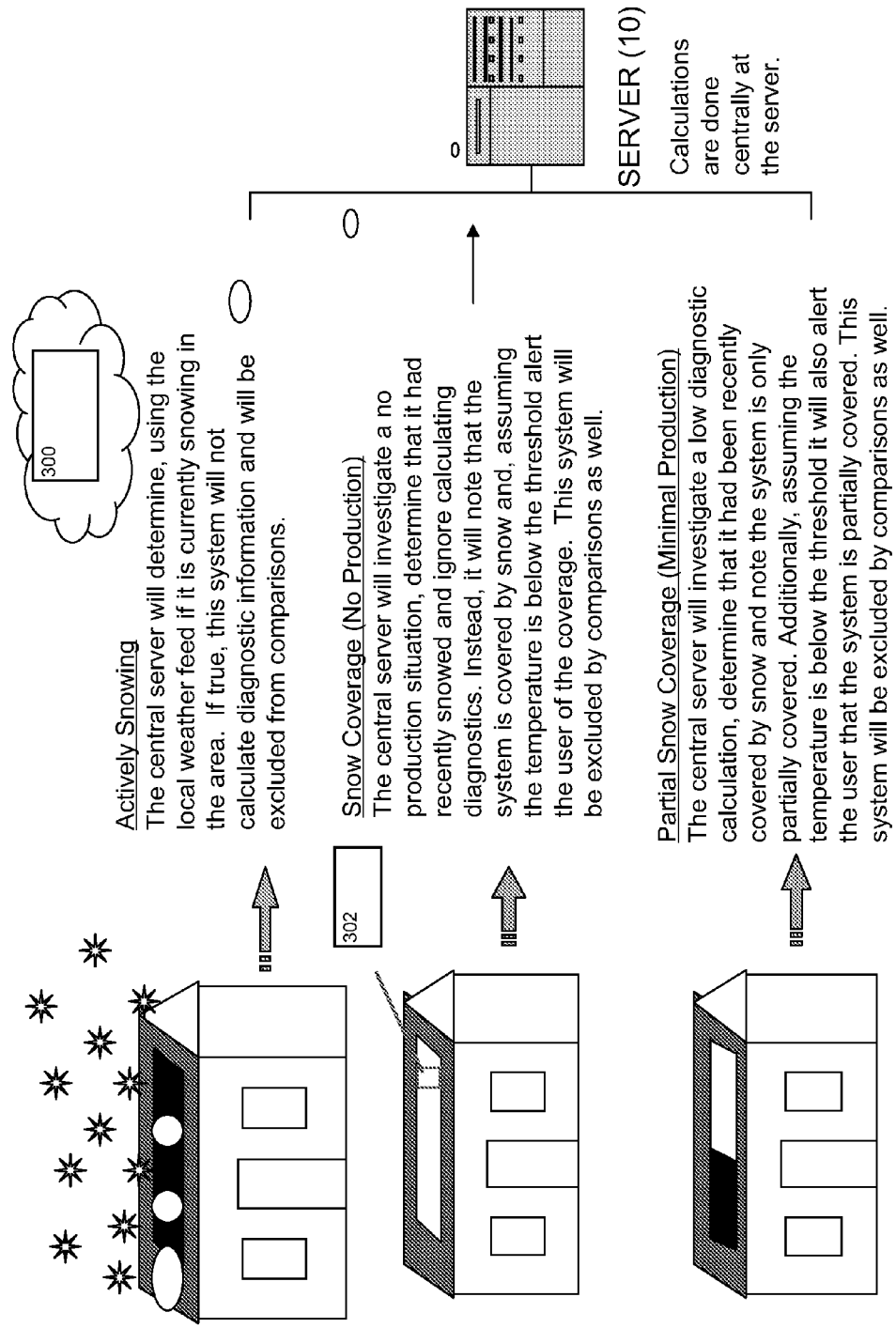
Figure 6 – Different Snow Conditions

COMPARABLE DIAGNOSTICS FOR RENEWABLE ENERGY POWER SYSTEMS

This application claims priority to and is a continuation of application Ser. No. 12/777,221 filed May 10, 2010 (and now issued as U.S. Pat. No. 8,190,395) which is a continuation-in-part of application Ser. No. 11/949,035 filed Dec. 2, 2007 (and now issued as U.S. Pat. No. 7,742,897) entitled "Systems and Methods for Monitoring and Diagnosing the Power Generated by Renewable Power Systems" and claims priority to and is a continuation-in-part of application Ser. No. 11/673,649 Feb. 12, 2007 now abandoned entitled "Systems and Methods for Providing Renewable Power Systems by Aggregate Cost and Usage" all of which are incorporated herein by reference.

The present invention relates to systems and methods for measuring and diagnosing the power generated by renewable energy power systems. More specifically, methods and logic for solar system monitoring to accurately account for specific weather conditions, e.g. snowy conditions, when computing diagnostic data that is based on comparing solar systems.

As the field of renewable power/renewable energy systems grows, monitoring the performance and output of these systems on an ongoing basis becomes more important for the following reasons: 1) it helps quantify to the system owner the exact benefits of the system; 2) it informs the system owner or service provider of issues so that they can be resolved quickly, reducing wasted generation capacity; and 3) it provides data which over time can be used to improve renewable energy system design and performance.

Monitoring is becoming even more important as new solar technologies are introduced to the market. Today, most installed Photovoltaic solar arrays rely on poly silicon cells to generate electricity. These are encased in glass and are extremely durable, though expensive. Many new technologies will soon be on the market, some of which are printed on thin films and do not use silicon at all as a conductor. While these technologies are much less expensive and will greatly aid in the spread and adoption of solar power, their long-term efficiency and durability are less well known. Therefore, ongoing monitoring is critical to both deploying and supporting these systems.

Examples of monitoring of renewable energy systems may include whether the system is on or off, the amount of energy being generated, how the system is performing against expected performance and how the system is performing given various environmental data. There are many factors which impact the generation from a solar renewable energy system, including shading, dust and dirt, wind/temperature, module degradation and inverter efficiency. Each factor can impact the system by over 10%, sometimes affecting output as much as 100%. It is fairly easy to see that while each factor can impact the system, some are broadly environmental and cannot be remedied (e.g. temperature), others are local and can be fixed relatively easily (e.g. dirt, shade or snow) and some are system related and may need to be fixed immediately (e.g. inverter faults).

While all of these measurements are important, they do not always do a sufficient job of quickly informing the system owner or service provider of a problem with the system. The reason they do an incomplete job is that none provides an inexpensive and reliable means of 1) truly knowing that a problem resides within a particular system (vs. being an environmental factor), and 2) diagnosing the magnitude of the problem. The reason for this is because many factors affect the performance of solar energy systems (both Photovoltaic and Solar Hot Water), and it is very difficult to efficiently determine the specific issue remotely. For example, a system may be performing below expectation because of excessive wind or cloudiness, but this does not imply any fundamental system issue and does not warrant a service visit. On the other hand, the system may be underperforming because of growth of nearby trees or a thin film of dirt on the panels, which are easy to remediate by either the owner or a service provider.

Another example of an important but potentially faulty environmental measurement system is a locally placed sunlight metering device (radiance meter). If this produces readings which differ from the expected output of the solar panels, it will highlight an issue. But if both are dirty due to the same ongoing dust from a local construction site, the issue will not be known.

It cannot be overstated how important it is that renewable energy solar systems perform as close to optimally as possible. A system which produces electricity valued at $3,000 per year, which has a 10% degradation that can easily be fixed (e.g. through cleaning) loses $300 per year. Given the 25+ year life of the system (and without accounting for inflation in the value of electricity), this translates into a loss of $7,500 worth of generation, as well as the additional cost of the $7,500 (or more) the user must pay for power to replace the lost generation. An efficient solution to many of these potential losses is comparative diagnostics, as opposed to, by way of example, potentially costly and complex sensors. While it is very difficult to isolate root causes of system issues (there are several different types and these can have a significant impact as described above), by taking a statistically significant sampling of comparable renewable energy systems within a geographic area, a Geographic Average can be created on an ongoing basis. This will not control for every variable affecting each system (e.g. a system on a hill may experience more wind than a system in a more protected area), but given adjustments, comparing each system's performance against this point-in-time average can efficiently highlight issues with a given system and alert the system owner and service provider that there is a potential issue that needs correction.

These and other features, aspects and advantages of the present invention will become better understood with reference to the following description and claims.

SUMMARY OF THE INVENTION

The present invention relates generally to systems and methods for measuring, monitoring, comparing and diagnosing the power generated by at least two renewable power systems provided to a consumer.

According to one embodiment of the present invention, a computer processor implemented method of measuring, monitoring, comparing and diagnosing the power generated of at least two renewable power systems provided to at least two consumers and alerting at least one of the consumers in the event of comparative underperformance, the method comprising the steps of; providing at least two renewable power systems, at least one data server, at least one generation monitoring device in communication with at least one renewable power system and, optionally at least one communication node in communication with at least one of the renewable power system, generation monitoring device and data server, determining at least two diagnostic variables for each renewable power system and saving each diagnostic variable into at least one data server, wherein at least two of the diagnostic variables are weather and renewable power system cover status; determining the energy generated by each renewable power system for a specific time period to provide a normalized performance and saving the normalized performance in at least one data server along with the corresponding weather and renewable power system cover status; wherein the at least one data server determines comparative information for a predetermined geographic area based upon at least two diagnostic variables, and at least two of the normalized performances to provide a comparative value; and informing the consumer of the comparative value in the event of an underperforming comparative value.

According to another embodiment of the present invention, a computer processor implemented method of measuring, monitoring, comparing and diagnosing the power generated of at least two renewable power systems provided to at least two consumers and alerting at least one of the consumers in the event of comparative underperformance taking into account the effects of power system cover status (e.g. snow covering solar panels, debris from inclement weather covering solar panels, etc.), the method comprising the steps of; providing at least two renewable power systems, at least one data server, at least one generation monitoring device in communication with at least one renewable power system and optionally at least one communication node in communication with at least one of renewable power system, generation monitoring device and data server, determining at least two diagnostic variables for each renewable power system and saving each diagnostic variable into at least one data server, wherein at least two of the diagnostic variables are weather and renewable power system cover status; selecting a predetermined temperature threshold for a geographic area and issuing a directive to the communication node to either obtain diagnostic data or ignore diagnostic data from a particular renewable power system according to whether the temperature is above or below a predetermined temperature threshold; issuing a directive to the communication node to either obtain diagnostic data or ignore diagnostic data according to the renewable power system cover status; determining the energy generated by each renewable power system which were issued a directive to the communication node to obtain diagnostic data for a specific time period to provide a normalized performance and saving the normalized performance in at least one data server along with corresponding weather and renewable power system cover status; wherein at least one data server determines comparative information for a predetermined geographic area based upon at least two of diagnostic variables, and at least two of normalized performances to provide a comparative value; and informing the consumer of the comparative value in the event of an underperforming comparative value.

These and other features, aspects and advantages of the present invention will become better understood with reference to the following description and claims.

BRIEF DESCRIPTION OF THE DRAWINGS

FIG. 1 depicts the present invention;
FIG. 2 depicts the present invention;
FIG. 3 depicts the present invention;
FIG. 4 depicts the present invention;
FIG. 5 depicts the present invention; and
FIG. 6 depicts the present invention.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

The present invention provides a method, software applications and formulas to gather data on different renewable energy systems within a geographic area, and to use this data from the different systems to efficiently derive important Comparative Diagnostic information on each of the systems on an ongoing basis. This diagnostic information can be used to detect and report system issues. Specifically, the Invention does this by assigning individual System Coefficients to each renewable energy system (for example, a solar photovoltaic system) when they are set up. These System Coefficients contain important characteristics such as expected generation for the system, expected sunlight for the specific location, impacting features such as roof pitch, building orientation, etc. Then, on an ongoing basis, the Invention utilizes a data gathering/processing infrastructure to calculate individual normalized performances for each renewable energy system, and then combines these to create a statistically significant geographic average for each local area. Each individual system's normalized performance is then compared over set durations against the geographic average for the area. Since these geographic averages inherently control for complex environmental data, they provide accurate renewable energy system diagnostics with less expense and fewer required sensors. In addition, the present invention provides a method and a system for monitoring the diagnostics, and providing them to both the owner of the system as well as third parties who are then able to address the issues with the renewable energy systems. For example, service providers who may correct issues with the renewable energy system. The term renewable power system may be interchangeable with at premise renewable power system, renewable energy system and at premise renewable energy system. The renewable power system may be, by way of example, a solar system, solar panel system, photovoltaic, thermal, wind powered, geothermal, hydropower.

With reference to FIGS. 1-6, a computer processor implemented (e.g. server 10) method of measuring, monitoring and comparing the power generated of at least two renewable power systems (e.g. 102, 104, 106, 108, 110, 112) provided to a consumer is provided. According to one embodiment, to be statically relevant at least forty (40) renewable power systems must be monitored and data acquired from the renewable power systems. There may be at least two renewable power systems (e.g. 102, 104, 106, 108, 110, 112), at least one data server (10), at least one generation monitoring device (16) in communication with one at premise renewable power system (30) and at least one communication node (22) in communication with at least one of the renewable power system (30), the generation monitoring device (16), the data server (10). The renewable power system may have Background Constants that are entered into the system during data setup; populating this part of the data structure is one of the initial steps to the process. During this time, all required (or potentially required) background information is loaded into the system. This data will later be used for system calculations and diagnostics. Background constants may include: (1) full calendar with sunrise and sunset according to latitude throughout the year; (2) insolation or 'incident solar radiation': This is the actual amount of sunlight falling on a specific geographical location. There are expected amounts of radiation which will fall on an area each day, as well as an annual figure. Specific insolation is calculated as kWh/m2/day. The importance of this variable is that it can combine several other background constants; and (3) location functionality. This software helps determine the proximity of each system to each other system, and forms a key part of the algorithm used to determine the geographic average of the renewable energy systems. While there are different specific methods of implementing location functionality, generally this relies on a large database of locations which are tied to zones. Because the relational distances between the zones are stored within the software, the distances between any two locations can then be easily and accurately calculated.

There may be the step of determining at least one diagnostic variable for each renewable power system (30). These are the variables which affect the diagnostics. Examples include: (1) adjustments to the permitted size of each zone. When there are fewer systems within an area, the algorithm may be adjusted to allow for a statistically accurate comparison, but this would also reduce the ability of the comparison to control as well for weather, etc., since there may be more variances over the distance; (2) adjustments to the sensitivity of the diagnostics. Changing thresholds will impact when a particular renewable energy system is identified by the software as having an issue. Each at least one diagnostic variable is saved into at least one data server.

The method may comprise the step of determining at least one system coefficient for each renewable power system and saving each system coefficient in the data server(s). These are set up when each new renewable energy system is entered into the software, and they provide key information about the expected performance of each system. The coefficients will generally stay the same for the life of the system. Not all system coefficients will be used in each comparative diagnostic, but they all may be used at some point to provide additional functionality to the process. One critical aspect of the system coefficients is that ALL coefficients for all renewable energy systems must be assigned using the same approach and rules. The reason for this is that if the system coefficients are not uniformly applied, the normalized performance values (described below) will not be accurate. The items which can make up the system coefficient include: (1) expected generation by day, month and year for the system; (2) expected generation on an ongoing basis (e.g. average generation each day, regardless of time of the year); (3) renewable energy system size; (4) system technology; (5) system tolerances (e.g. how accurate information from the system's components will be); (6) system shading; (7) system orientation; and (8) an 'adjustment factor' which can be entered by admin to adjust for how the system actual works to reduce 'false' signals if the system does not work as initially expected. This is represented as a percentage affecting the calculations:

The energy generated by each renewable power system is recorded and the data server then determines comparative information based upon at least one of the background constant, the diagnostic variable, the system coefficient and the energy generated to determine a comparative value of the renewable power system. The term comparative value is intended to include any value that compares one system to another system or a group of systems. For example, this may be as simple as an "underperforming" designation when the system's performance is less than another system or group of systems performance in terms of power generated.

The normalized performance is then calculated. This is an ongoing calculation which is done for each renewable energy system which is connected to the software. Essentially, the normalized performance is a renewable energy system's actual performance for a given time period multiplied by its individual system coefficient.

The formula for this for a given time period is:
$$NP = Gen * SC$$

This equation is fundamental to performing comparative information and comparative diagnostics since it enables the results from disparate systems to be 'normalized' and therefore directly compared. These normalized performance readings can then aggregated into larger periods (24 hours, 7 days, 1 month) for comparison.

The comparative information may be a 'geographic average'. The geographic average may be calculated by an algorithm which produces an average of the normalized performances for each area covered. The purpose is to be able to efficiently perform comparative diagnostics regularly (e.g. every 5 minutes) for a large number of areas containing a large number of renewable energy systems without overly taxing the servers' processors. The main steps of this algorithm are as follows: (1) The software will randomly select forty (40) renewable energy systems within each of the algorithm's defined localities; (2) The normalized performance for these forty (40) systems will be summed and then divided by forty (40); (3) This results in a statistically significant geographic average which will then be recorded on the database; (4) An important feature of this algorithm is that much of the complexity is dealt with at the individual renewable energy system level with the system coefficient. The simplicity of the algorithm is important for processor efficiency and ongoing data production.

There may be a comparative diagnostics process. Once the normalized performance and the geographic average are known for a given renewable energy system, these two figures can be compared to determine how well the system is performing vis-à-vis expectations. The reason the results of this are valid regardless of time of year or environmental conditions is because these factors are all controlled for within the local sampling of related systems. Based on the factors noted above which can degrade system performance, the comparative diagnostics can be used to determine when a renewable energy system is performing sub optimally, therefore the comparative value may be "underperforming" or any other term indicating an issue. If the comparative value falls below certain thresholds (e.g. 7.5% below the geographic average signals a system issue) these diagnostics can then be used to remediate the issue and improve the system's performance. The diagnostics can be broken out into periods of different length (24 hours, 7 days and 1 month) which have the following benefits: (i) 24 Hour Comparisons: While a 5 minute segment may show variance between one renewable energy system and the group's geographic average, the variance may not be due to any inherent system issue (e.g. a single cloud may be temporarily affecting one system without impacting others in the vicinity). However, over a 24 hour period, these environmental factors are normally controlled for, and any significant variance will reveal a legitimate system issue. The fact that this is done over a rolling 24 hours means that the information will be received by the renewable system owner or service provider relatively quickly, without the requirement of waiting for a weekly or monthly report; (ii) weekly comparisons: though this does not provide the same sort of timely information that is provided by 24 Hour Comparisons, the additional data will allow for more accurate diagnostic comparisons since environmental variables will have even less impact; (iii) monthly comparisons: While more accurate than weekly comparison, this will be used mostly as a reporting mechanism to show system status and performance.

There may be at least one inverter (14) in communication with the renewable power system (e.g. 50, 30). The inverter

(14) is an electronic circuit that converts direct current (DC) to alternating current (AC). There may also be at least one return monitor (18) determining the energy returned to a grid by said at-least one renewable power system. The method may comprise the step of determining at least one background constant and saving each background constant in the data server(s).

There may also be the steps of determining if the renewable power system can be remotely adjusted and remotely making a change to the renewable power system. By way of example, it may be possible to remotely monitor the system and change the angle of a solar panel to provide increased sunlight.

The system for measuring, monitoring, comparing and diagnosing the power generated from at least two renewable power systems as it is generated at a consumer's premises may have: at least two renewable power systems, wherein each renewable power system (e.g. 30, 50) is at least partially powered by at least one alternate energy source; at least one generation monitoring device (e.g. 58), wherein the at least one generation monitoring device (e.g. 58) calculates the energy generated at each consumer's premises by the renewable power system (e.g. 30, 50); at least one communication node (64) in communication with each at least one generation monitoring device (e.g. 58); at least one data server (10) in communication with communication node (e.g. 64), wherein the data server(s) (10) accept information from the communication node (e.g. 64) to determine the power generated at a first user's premises (100) and compare the power generated at a first user's premises (100) to Comparative Information obtained from at least two renewable power systems (e.g. 102, 104, 106, 108, 110, 112, 114) to determine if the first user's renewable power system (100) is within a predetermined deviation from the comparative Information. This may provide a comparative value. The communication node may be further comprising a data storage means for storing usage information. The generation monitoring device may be selected from the group consisting of pulse meter, temperature meter, electromechanical meter, solid state meter, flow meter, electric meter, energy meter and watt meter. There may also be at least one return monitoring device in communication with the inverter which calculates the energy returned to a grid by the system.

The at-premise renewable power system may be, for example, a solar system, solar panel system, photovoltaic, thermal, wind powered, geothermal, hydropower. A secondary energy source (e.g. 52) may be in communication with and at least partially powering the renewable power system. It should be understood, though, this is only for ancillary power in the event that the renewable energy source (50) is not capable of entirely powering the at premise renewable power system.

The generation monitoring device may be any type of meter, by way of example, this may include a pulse meter, temperature meter, electromechanical meter, solid state meter, flow meter, electric meter, energy meter and watt meter. Each installation of the Invention will have a communication node or hub set up at the location with the system. One of the communication nodes may act as a hub. These devices connect to the internet and send the data collected by the nodes to the Server. They have the following properties: The hub has a web server and connects to a standard internet connection (Ethernet). It does not require a computer or other device to make this connection. Each hub has its own unique IP or DNS address. The hub is configured by a web browser. The web browser allows the hub to have specific nodes assigned to it. This set up feature will allow another hub in the area to be set up with its own nodes so that all can operate wirelessly without disruption. Also, the hub is able to configure specific aspects of the hub, such as the connection with the server, data recording and time settings and the ability to configure the attached nodes, including their recording properties.

The hub may connect wirelessly or through wire-line including through AC power to the various nodes in its network and may handle several nodes, sending up the data of each within a separate data stream to the server. Typically the hub would plug into a standard AC outlet and have LEDs to show operation and diagnostics. The hub may also record data, so that if the Internet connection is ever down, data from the nodes will not be lost. It will also have the option of a tamper resistant casing and minor router capabilities—so that it could stand in front of a standard router and act as the primary data entry point for a location. The hub will also be able to operate behind a router. All of the hubs may connect to a centralized database for data aggregation. This database will be able to relate the information from each node according to the time recorded. Specific data which will be saved may include: (1) hub IP#/DNS information; (2) node IP#/DNS information/name; (3) timestamp increment; (4) hot water flow by unit (gallon or liter) per time increment; (5) electric flow by unit (kilowatts) per time increment; (6) fuel flow by unit (depends on fuel type) per time increment; and (7) other information as required (e.g. water temperature).

Each installation of the Invention will have typically one or more generation recording nodes. These are typically connected wirelessly to the hub, and connected directly to the inputs/outputs from the renewable power system. They communicate constantly with the various devices and transfer data which is then sent to the server. They may have the following properties: The first required node connects to a flow meter attached to the water tank that is connected to the solar hot water system. This node will operate as a pulse meter, 'clicking' whenever a unit (either a gallon or a liter) of hot water passes from the tank. The second required node connects to either the electric panel at the switch for the Hot Water tank's electric power OR to a flow/other meter for gas/oil to the secondary heater for the Hot Water tank. The node may have a data storage means for storing flow/usage information. There may also be other nodes, which may be used to measure other aspects of the system and gain even more accurate readings. For example: the temperature of the hot water on an ongoing basis. The system may be monitored from a remote location (such as a computer in a different location).

The present invention provides monitoring for solar systems, computes diagnostics by comparing systems and benefits from being able to tell when a particular system is experiencing snowy conditions. This present invention provides methods and system so that it can be correctly determined when a solar panel is being snowed on and when it is covered or partially covered by snow. If a panel is currently being snowed on or has been snowed on, it may be excluded from the statistical pool. In the absence of this, it cannot be differentiated between snowy and non-snowy conditions, which can result in false-negatives/false-positives when diagnostics are computed. This can typically occur the following day after a snow storm. Due to varying angles of incidence in each solar panel one system may have completely shed it's snow coverage while another may still be completely covered. In this case, diagnostics that do not account for snow will report both falsely that the panel without coverage is outperforming expectations and the one covered is experiencing a critical issue. The Methodology seeks to remedy this and similar situations by identifying snow covered panels and to exclude them from radial area comparisons. This will provide accurate reporting and allow a normal diagnostic for non-covered panels and accurately alert the covered panel's user or service provider.

According to one aspect of the present invention, a computer processor implemented method of measuring, monitoring, comparing and diagnosing the power generated of at least two renewable power systems (e.g. 102, 104, 106, 108, 110, 112) provided to at least two consumers and alerting at least one of said consumers in the event of comparative underperformance is provided, the method comprising the steps of; providing at least two renewable power systems (e.g. 102, 104, 106, 108, 110, 111, 112), at least one data server (10), at least one generation monitoring device (16) in communication with at least one said renewable power system and at least one communication node (22) in communication with at least one of the renewable power system, the generation monitoring device and the data server, determining at least two diagnostic variables for each renewable power system and saving each diagnostic variable into the at least one data server, wherein at least two of the diagnostic variables are weather and renewable power system cover status. The weather and temperature may be obtained from a third party internet (300) weather feed source and grouped by zip code and saved in at least one data server (10). The weather may also be obtained from a third party internet weather feed source and the temperature is obtained by a temperature probe (302) attached to the renewable power system and the weather and temperature are grouped by zip code and saved in at least one data server (10). Each time a solar system's diagnostic is computed, it's location may be matched to a particular weather and temperature based on the system's zip code. If a system manager chooses, he can attach a temperature probe to the solar panels to get a more accurate temperature than the one provided by the weather feed. The method may next determine the energy generated by each renewable power system for a specific time period to provide a normalized performance and save the normalized performance in at least one data server (10) along with the corresponding weather and renewable power system cover status. The renewable power system cover status may be covered, partially covered, uncovered and indeterminate. For example, when it has snowed, or there had been a volcanic eruption covering the roof with a layer of soot, the renewable power system cover status would be covered. The roof may also be partially covered (for example, there may be unmelted snow on one portion of the roof, or debris covering a portion of the roof). The roof would be uncovered in its normal state and it would be indeterminate in many cases including a communication error with a particular renewable power system. The preferred renewable power system in the present invention would be solar panels, but it could be any renewable power system and the likely issue presented with the panels being covered, provided herein without limitation, would be snow covering or partially covering the panels. However, there are many issues that could present covered solar panels including debris, a dust storm, volcanic ash, etc. During the time when the diagnostic data is computed, if the software logic finds that the current weather conditions is "snowing" then it will immediately cease calculating. It will instead mark a field indicating "is snowing at this time" within the software to record the fact that it was snowing at the time. There may be the issue of no or low production following an event, such as snow precipitation or coverage. The at least one data server determines comparative information for a predetermined geographic area based upon at least two of the diagnostic variables, and at least two of the normalized performances to provide a comparative value; and informs the consumer of the comparative value in the event of an underperforming comparative value.

During diagnostic computation, if a system was set "is snowing at this time," "snow is covering panel" (resulting in a renewable power system cover status of COVERED)" or "snow is partially covering panel" (resulting in a renewable power system cover status of PARTIALLY COVERED), the method will look at the energy production. The present invention providing a threshold time period and determining the energy generated by each renewable power system for the threshold time period, then sending an alert to the consumer according to the energy generated by each renewable power system for the threshold time period. By way of description, without limitation, if no energy was produced in the last time period and the environmental temperature is below a threshold, a countdown timer is set. If no energy was produced, and the environmental temperature is above a threshold, the countdown timer decremented. If the timer falls below 0, an alert is sent to the queue indicating an issue. If some energy was produced in the last time period, the diagnostic production value is below expectations, and the environmental temperature was below a threshold, a countdown timer is set. If instead the environmental temperature was above a threshold, the countdown timer decremented. If the timer falls below 0, an alert is sent to the queue indicating an issue. Once all systems are checked for potential snow coverage issues individually (i.e., step 5), a check is made for outlier systems in a given area. If less than X % (a predetermined percentage, for example five percent (5%)) of systems in a given area are affected by snow, flag the outlier systems that were affected (e.g., if only 1 out of 1000 systems in an area are affected, there is a good chance the one system tagged as affected by snow actually has a different type of problem). If Y % of systems in a given area that were affected by snow have since recovered, flag the systems that have not recovered as potentially having an issue (e.g., if only 1 system out of 1000 affected has not recovered, it may actually have a different issue).

Each system user or service provider may set a temperature threshold. The threshold should be set to a degree that regardless of that particular system's panel's angle of incidence, if the average temperature over the hour was above the threshold there is no possibility of snow covering the panel (for example, it may be selected to be 32 degrees Fahrenheit or 40 degrees Fahrenheit. If the temperature feed stated above is available, the average temperature is computed using this data, otherwise the weather feed information is used. When the software is computing the diagnostic for any given system it should exclude nearby systems that fall in it's radial area if any of the special snow fields are set to true. The special snow fields are "is snowing at this time," "snow is covering panel (renewable power system cover status of COVERED)," and "snow is partially covering panel" (renewable power system cover status of PARTIALLY COVERED). The renewable power system cover status may be determined by the weather status (for example SNOWING) or the comparative diagnostics (for example, if the power generated by a geographic area is significantly reduced, we know it is not a single renewable power system, accordingly, we do not alert the consumer, as it is a temporary issue and not one that requires alerting the panel's user or service provider. As shown in FIG. 5, systems 111 are snow COVERED, accordingly they may be ignored from geographic comparisons. There may also be the step of determining a geographic average of at least two renewable power systems; determining the energy generated by each renewable power system for a specific time period and saving the energy generated in the at least one data server along with the corresponding renewable power system cover status. Then the data server determines comparative information for the predetermined geographic area and at least two of the normalized performances to provide a comparative value; and informs the consumer of the comparative value in the event of an underperforming comparative value. There may be the situation that even though an entire geographic area is at experiencing a partially covered renewable power system cover status, a single system is still underperforming. In this case, it may be indicative of a problem and would inform the consumer.

There may also be the step of selecting a predetermined temperature threshold for a geographic area and issuing a directive to the communication node to either obtain diagnostic data or ignore diagnostic data from a particular renewable power system according to whether the temperature is above or below the predetermined temperature threshold. For example, if the temperature is above 50 degrees Fahrenheit, we know a snow event resulting in a renewable power system cover status of COVERED is highly unlikely. The present invention also provides that a directive may be issued to the communication node to either obtain diagnostic data or ignore diagnostic data according to the renewable power system cover status. For example, if it determined that the renewable power system cover status is COVERED, we may want to ignore diagnostic data.

There may also be the steps of randomly selecting a predetermined number of renewable power systems in a predetermined geographic area; determining the normalized performance of each randomly selected renewable power system, summing the normalized performances to provide a sum and dividing the sum by the predetermined number to provide a geographic average performance; and saving the geographic average performance in said data server. The consumer may be alerted if their at least one renewable power systems performance is a predetermined amount lower than the geographic average performance.

The present invention also envisions that it may be determined if the at least one renewable power system can be remotely adjusted; and if it can be remotely adjusted, there present invention performs the step of remotely making a change to the at least one renewable power system. For example, if a solar panels is partially covered and the system may be remotely adjusted up and down, a slight shift may knock the snow off, allowing the solar panel to be uncovered and fully operational.

By way of example, the following provides a snow condition algorithm that may be stored in the data server as in the present invention.

Definition of Variables:
  SID = Unique System Identifier
  Wf = Current Weather Condition
  avgT = Average Temperature (over last 24 hours)
  threshT = User Defined Temperature Threshold
  Sn = "Is Snowing At This Time" Field
  Sc = "Snow Is Covering Panel" Field
  Spc = "Snow Is Partially Covering Panel" Field
  DV = Diagnostic Value
  newDV = New Diagnostic Value
  threshDV = Diagnostic Threshold
  EN = Energy Produced by System
  NSI = Nearby System Indicator
  Timer = countdown timer to flag malfunctioning systems
  AffectedSystemThreshold = % threshold for flagging outlier systems affected by snow
  AreaRecoveredThreshold = % threshold for outlier systems not recovering from snow coverage
  f_AreaAffectedSystems = % of systems in Sn, Sc, Spc states in a particular area
  f_AreaRecoveredSystems = % of systems in a particular area that changed from Sn, Sc, or Spc states
    TRUE to FALSE in the last time period Algorithm—Individual system

```
DIAGNOSTIC_COMPUTATION {
    FOR (EACH SYSTEM)
        f_GET_WEATHER_INFO_BY_ZIP (SID) {
            RETURNS (Wf,avgT)
        }
        IF (Wf equals "Snowing")
            SET Sn = TRUE, Sc = FALSE, Spc = FALSE, DV = NULL
        ELSE IF (current time is daytime)
            f_GET_ENERGY_PRODUCED_LAST_HR (SID) {
                RETURNS (EN)
            }
            f_GET_SNOW_DATA_FROM_LAST_HR (SID) {
                RETURNS(Sn, Sc, Spc)
            }
            IF(EN <= 0)
                IF(Sn equals TRUE OR Sc equals TRUE OR Spc equals TRUE)
                    IF (avgT < threshT)
                        Timer = default
                        f_ADD_TO_ALERT_QUEUE (SID) {
                            "MILD - Panel Is Covered"
                        }
                        SET Sn = FALSE, Sc = TRUE, Spc = FALSE, DV = NULL
                    ELSE IF
                        Timer = Timer – 1
                        IF(Timer < 0)
                            f_ADD_TO_ALERT_QUEUE (SID) {
                                "CRITICAL - Issue With Panel"
                            }
                            SET Sn = FALSE, Sc = FALSE, Spc = FALSE, DV = NULL
                    ELSE
                        f_COMPUTE_DIAGNOSTIC_FOR_SYSTEM (SID)† {
                            RETURNS(newDV)
                        }
                        SET Sn = FALSE, Sc = FALSE, Spc = FALSE, DV = newDV
                ELSE
                    f_COMPUTE_DIAGNOSTIC_FOR_SYSTEM (SID)† {
                        RETURNS(newDV)
                    }
                    IF(newDV < threshDV)
                        IF(Sn equals TRUE or Sc equals TRUE or Spc equals TRUE)
                            IF (avgT < threshT)
                                Timer = default
                                f_ ADD_TO_ALERT_QUEUE (SID) {
                                    "MILD - Panel Is Partially Covered"
                                }
                                SET Sn = FALSE, Sc = FALSE, Spc = TRUE, DV = newDV
                            ELSE
                                Timer = Timer – 1
                                IF(Timer < 0)
                                    f_ADD_TO_ALERT_QUEUE (SID) {
                                        "CRITICAL - Issue With Panel"
                                    }
                                    SET Sn = FALSE, Sc = FALSE, Spc = FALSE, DV =NULL
                        ELSE
                            SET Sn = FALSE, Sc = FALSE, Spc = FALSE, DV = newDV
```

-continued

```
}
Algorithm—comparison of snow-affected systems
DIAGNOSTIC_COMPUTATION {
    FOR (EACH AREA) {
        IF (f_AreaAffectedSystems < AffectedSystemThreshold)
            f_ADD_TO_ALERT_QUEUE (SID) {
                "MILD - Panel appears affected by snow when
neighbors are unaffected"
            }
        IF (f_AreaRecoveredSystems < AreaRecoveredThreshold)
            f_ADD_TO_ALERT_QUEUE (SID) {
                "MILD - Panel has not recovered from snowfall,
despite most neighbors recovering"
            }
    }
}
```

†- Note: This Function Ignores All Nearby Systems That Have Sn, Sc, Spc Equal to True It should be understood that the foregoing relates to preferred embodiments of the invention and that modifications may be made without departing from the spirit and scope of the invention as set forth in the following claims.

We claim:

1. A computer processor implemented method of measuring, monitoring, comparing and diagnosing the power generated of at least two renewable power systems provided to at least two consumers and alerting at least one of said consumers in the event of comparative underperformance, said method comprising the steps of;
    providing at least two renewable power systems each having a generation monitoring device in communication with at least one data server;
    assigning individual system coefficients to each renewable energy system;
    determining at least two diagnostic variables for each said renewable power system and saving each said diagnostic variable into said at least one data server;
    determining the energy generated by each said renewable power system for a specific time period to provide said renewable power system's energy generated performance for a given time period;
    determining the normalized performance for each said renewable power system, wherein the normalized performance is said renewable power system's energy generated performance for a given time period multiplied by said individual system coefficient;
    to provide a normalized performance and saving said normalized performance and said diagnostic variables in said at least one data server;
    wherein said at least one data server determines comparative information for a predetermined geographic area based upon at least two of said diagnostic variables and at least two of said normalized performances to provide a comparative value; and
    informing said consumer of said comparative value in the event of an underperforming comparative value.

2. A computer processor implemented method as in claim 1, wherein at least two of said diagnostic variables are weather and renewable power system cover status.

3. A computer processor implemented method as in claim 2, wherein said corresponding renewable power system cover status is selected from the group consisting of covered, partially covered, uncovered and indeterminate.

4. A computer processor implemented method as in claim 2, wherein said weather and temperature are obtained from a third party internet weather feed source and grouped by zip code and saved in said at least one data server.

5. A computer processor implemented method as in claim 2, wherein said weather is obtained from a third party internet weather feed source and said temperature is obtained by a temperature probe attached to said renewable power system and said weather and temperature are grouped by zip code and saved in said at least one data server.

6. A computer processor implemented method as in claim 2, further comprising the step of:
    determining a geographic average of at least two renewable power systems;
    determining the energy generated by each said renewable power system for a specific time period and saving said energy generated in said at least one data server along with said corresponding renewable power system cover status.

7. A computer processor implemented method as in claim 1, further comprising the step of:
    selecting a predetermined temperature threshold for a geographic area and issuing a directive to either obtain diagnostic data or ignore diagnostic data from a particular renewable power system according to whether the temperature is above or below said predetermined temperature threshold.

8. A computer processor implemented method as in claim 2, further comprising the step of:
    issuing a directive to either obtain diagnostic data or ignore diagnostic data according to said renewable power system cover status.

9. A computer processor implemented method as in claim 8, further comprising the step of:
    providing a threshold time period and determining the energy generated by each said renewable power system for said threshold time period;
    sending an alert to said consumer according to said energy generated by each said renewable power system for said threshold time period.

10. A method as in claim 1, wherein said step of determining comparative information for a predetermined geographic area based upon at least two of said diagnostic variables, and said normalized performance to provide a comparative value is further comprising the step of:
    randomly selecting a predetermined number of renewable power systems in said predetermined geographic area;
    determining the normalized performance of each said randomly selected renewable power system, summing said normalized performances to provide a sum and dividing said sum by said predetermined number to provide a geographic average performance; and
    saving said geographic average performance in said data server.

11. A method as in claim 10, further comprising the step of:
    alerting at least one consumer when said at least one renewable power systems performance is a predetermined amount lower than said geographic average performance.

12. A method as in claim 1, further comprising the steps of:
    determining if said at least one renewable power system can be remotely adjusted;
    remotely making a change to said at least one renewable power system.

13. A computer processor implemented method of measuring, monitoring, comparing and diagnosing the power generated of at least two renewable power systems provided to at least two consumers and alerting at least one of said consumers in the event of comparative underperformance, said method comprising the steps of;

providing at least two renewable power systems each having a generation monitoring device in communication with at least one data server, assigning individual system coefficients to each renewable energy system;

determining at least two diagnostic variables for each said renewable power system and saving each said diagnostic variable into said at least one data server, wherein at least two of said diagnostic variables are weather and renewable power system cover status;

selecting a predetermined temperature threshold for a geographic area and issuing a directive to either obtain diagnostic data or ignore diagnostic data from a particular renewable power system according to whether the temperature is above or below said predetermined temperature threshold;

issuing a directive to either obtain diagnostic data or ignore diagnostic data according to said renewable power system cover status;

determining the energy generated by each said renewable power system which was issued a directive to obtain diagnostic data for a specific time period to provide said renewable power system's energy generated performance for a given time period;

determining the normalized performance for each said renewable power system; wherein the normalized performance is said renewable power system's energy generated performance for a given time period multiplied by said individual system coefficient;

saving said normalized performance in said at least one data server with said corresponding weather and renewable power system cover status;

wherein said at least one data server determines comparative information for a predetermined geographic area based upon at least two of said diagnostic variables, and at least two of said normalized performances to provide a comparative value; and informing said consumer of said comparative value in the event of an underperforming comparative value.

14. A computer processor implemented method as in claim 13, wherein said corresponding renewable power system cover status is selected from the group consisting of covered, partially covered, uncovered and indeterminate.

15. A computer processor implemented method as in claim 13, wherein said weather and temperature are obtained from a third party internet weather feed source and grouped by zip code and saved in said at least one data server.

16. A computer processor implemented method as in claim 13, wherein said weather is obtained from a third party internet weather feed source and said temperature is obtained by a temperature probe attached to said renewable power system and said weather and temperature are grouped by zip code and saved in said at least one data server.

17. A computer processor implemented method as in claim 13, further comprising the step of:
  determining a geographic average of at least two renewable power systems;
  determining the energy generated by each said renewable power system for a specific time period and saving said energy generated in said at least one data server along with said corresponding renewable power system cover status.

18. A computer processor implemented method as in claim 13, further comprising the step of:
  providing a threshold time period and determining the energy generated by each said renewable power system for said threshold time period;
  sending an alert to said consumer according to said energy generated by each said renewable power system for said threshold time period.

19. A method as in claim 13, wherein said step of determining comparative information for a predetermined geographic area based upon at least two of said diagnostic variables, and said normalized performance to provide a comparative value is further comprising the step of:
  randomly selecting a predetermined number of renewable power systems in said predetermined geographic area;
  determining the normalized performance of each said randomly selected renewable power system, summing said normalized performances to provide a sum and dividing said sum by said predetermined number to provide a geographic average performance; and
  saving said geographic average performance in said data server.

20. A method as in claim 13, further comprising the step of:
  alerting at least one consumer when said at least one renewable power systems performance is a predetermined amount lower than said geographic average performance.

21. A method as in claim 13, further comprising the steps of:
  determining if said at least one renewable power system can be remotely adjusted; and
  remotely making a change to said at least one renewable power system.

* * * * *